United States Patent [19]

Aronowitz

[11] Patent Number: 4,746,964
[45] Date of Patent: May 24, 1988

[54] MODIFICATION OF PROPERTIES OF P-TYPE DOPANTS WITH OTHER P-TYPE DOPANTS

[75] Inventor: Sheldon Aronowitz, San Jose, Calif.

[73] Assignee: Fairchild Semiconductor Corporation, Cupertino, Calif.

[21] Appl. No.: 901,502

[22] Filed: Aug. 28, 1986

[51] Int. Cl.$^4$ .................. H01L 29/167; H01L 29/78; H01L 29/36
[52] U.S. Cl. ........................................ 357/63; 357/90; 357/23.3
[58] Field of Search ........................... 357/63, 90, 23.3

[56] References Cited

U.S. PATENT DOCUMENTS 3,798,079  3/1974  Chu et al. ............................. 357/63
4,512,816  4/1985  Ramde et al. ......................... 357/34

OTHER PUBLICATIONS

Takeda et al, IEEE Transactions on Electron Devices, vol. ED-29, No. 4, Apr. 1982.
"Point Defect Generation During Phosphorous Diffusion In Silicon", J. C. C. Tsai et al, Journal for the Electrochemical Society: Solid-State Science and Technology, vol. 134, No. 6, pp. 1508-1518, Jun. 1987.

Primary Examiner—Andrew J. James
Assistant Examiner—John Lamont
Attorney, Agent, or Firm—Burns, Doane, Swecker & Mathis

[57] ABSTRACT

One p-type dopant is implanted into a substrate to modify the diffusion characteristics of another p-type dopant implanted into the substrate. As an example, gallium is diffused into a p-type region along with boron to confine the diffusion of the boron, and thereby produce smaller device regions in silicon. Along with the confined volume, the resulting regions exhibit electrical activity that is greater than the simple additive behavior of boron and gallium acting alone.

6 Claims, 5 Drawing Sheets

MODIFICATION OF PROPERTIES OF P-TYPE DOPANTS WITH OTHER P-TYPE DOPANTS

BACKGROUND OF THE INVENTION

The present invention is directed to monolithic integrated circuits, and in particular to the characteristics of p-type regions in integrated circuit devices.

In the design of integrated circuit devices, regions of one type of electrical activity are formed in or adjacent to regions that exhibit opposite electrical activity to provide desired operational characteristics. For example, a PMOS field-effect transistor comprises an n-type substrate having p-type source and drain regions formed at its surface. The n-type activity in the substrate is provided by doping a layer of silicon with a donor (Group V) impurity such as arsenic or phosphorous. The source and drain p-type regions are then formed by diffusing an acceptor (Group III) impurity, most notably boron, into two predetermined regions of the substrate.

One physical property that is characteristic of all commonly-employed p-type impurities is that they have relatively high diffusion coefficients. In other words, during the diffusion process or subsequent annealing steps in the fabrication of an integrated circuit, p-type impurity atoms tend to move a relatively great distance in the silicon. Consequently, the transistor must be large enough in size to accommodate the relatively large volumes occupied by the p-type source and drain regions and yet provide the desired electrical activity.

Accordingly, it is desirable to provide a technique for limiting the diffusion depth of p-type dopants to thereby enable smaller integrated circuit devices to be fabricated. One possible way to achieve this objective is to reduce the concentration of impurity atoms that are employed in the p-type region. Such an approach would enable shallower source and drain regions to be formed, for example. However, this approach is not without attendant limitations. In particular, these shallower regions of lower concentration exhibit increased electrical resistance, which compromises the electrical performance characteristics of the transistor. For example, the transistor might operate slower than a similar transistor with deeper and more highly concentrated p-type regions.

OBJECTS AND BRIEF STATEMENT OF THE INVENTION

Accordingly, it is an object of the present invention to provide a novel method for modifying the diffusion properties of p-type dopants without degrading their electrical characteristics.

It is a further object of the present invention to provide a novel integrated circuit structure which has p-type regions of limited volume but enhanced electrical activity.

In accordance with the present invention, these objects and their attendant advantages are achieved by using one p-type dopant to modify the diffusion characteristics of another p-type dopant. For example, a limited amount of gallium can be implanted into a p-type region to a limited depth along with a greater amount of boron to confine the diffusion of the boron, and thereby produce smaller devices. Along with the confined volume, the resulting region exhibits electrical activity that is greater than the simple additive behavior of boron and gallium acting alone.

In operation, the control over the diffusion of the boron comes about from an attraction between the boron and the gallium during diffusion. Thus, by implanting the gallium with a relatively low amount of energy so that the depth of the implant is shallow, i.e., near the surface of a silicon substrate, the boron's attraction to the gallium will cause it to also remain near the surface during annealing. Conversely, if the gallium is deeply implanted at a high energy level, its effect will be to "pull" the boron atoms to greater depths than would normally occur during annealing, thus provided an enhanced diffusion pattern when desired.

Other suitable combinations of p-type dopants that provide similar results include aluminum-boron, gallium-aluminum, and indium-boron.

DESCRIPTION OF PREFERRED EMBODIMENTS

As described previously, the basic concept which underlies the present invention is the modification of the characteristics of a p-type impurity with the use of a second p-type impurity. The application of this principle in the fabrication of a PMOS field-effect transistor is illustrated in FIGS. 1A–1E.

Figure 1A:
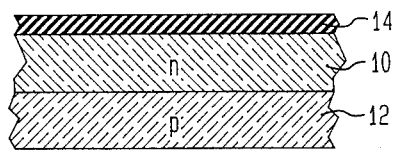
FIGS. 1A–1E are cross sectional side views of a silicon wafer during processing to form a PMOS transistor in accordance with the present invention.
Figure 1B:
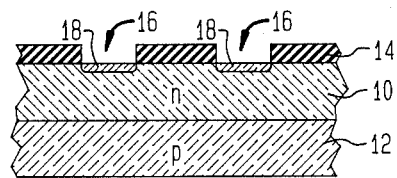

Referring to FIG. 1A, an n-type channel layer 10 is grown or otherwise suitably formed on a p-type substrate 12. An oxide layer 14 is then formed over the channel layer. As shown in FIG. 1B, two windows 16 are formed in the oxide layer in the areas where the source and drain regions of the transistor are to be located. Gallium ions are implanted through the windows 16 into areas 18 along the surface of the channel layer 10. If desired, a thin layer of oxide can be left in each window in order to provide better control over the depth of the implant.

Figure 1C:
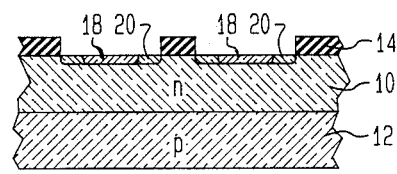
Figure 1D:
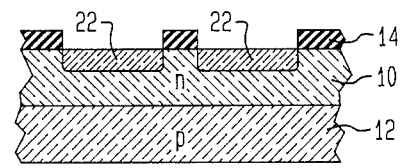
Figure 1E:
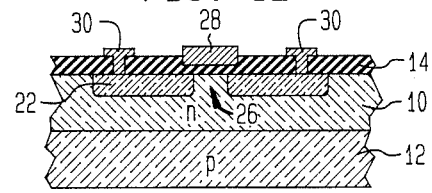

After the gallium ion implant, the windows 16 are enlarged as shown in FIG. 1C. Boron ions are then implanted into areas 20 through these enlarged windows. The energy levels that are employed during each of the ion implants are preferably chosen relative to one another so that the depth of the peak concentration is approximately the same for both impurities if it is desired to constrain the diffusion of boron. The entire structure is heated for a suitable period of time to cause the gallium and boron ions to simultaneously diffuse into the channel layer 10 and thereby form the source and drain regions 22, as shown in FIG. 1D.

Subsequently, the remainder of the oxide layer 14 is removed and a new oxide layer 24 is formed over the entire structure. The height of a portion of the layer 24 overlying the channel region 26 between the source and drain regions is reduced, for example by etching, and a gate electrode 28 is deposited in this area. In addition, holes are opened over the source and drain regions and contacts 30 are provided for electrical connection of the transistor in a well-known manner.

The combination of a pair of p-type dopants as described above results in highly stable complexes in a confined volume. Because of their attraction for one another, the two impurities tend to diffuse together, so that each is distributed throughout the p-type region formed by the diffusion. The combined impurities exhibit diffusion distances that are up to ¼ micron less than either impurity acting alone at similar levels of peak concentration. Another advantage that is provided is that molecular activity is created at lower annealing temperatures. Thus, annealing temperatures in the range of 700°-900° C., most preferably around 800° C., can be used rather than the 1000° C.+ temperatures that are typically employed. Accordingly, in the fabrication of CMOS circuits it becomes feasible to first do all n-channel processing and then follow with p-channel processing using lower temperatures or shorter annealing times, since the n-type dopants are not likely to diffuse any further in such a situation.

However, with higher annealing temperatures the modification of the diffusion characteristics can still be observed, although the effect may not be as pronounced.

Further characteristics of the invention are illustrated by means of the following examples.

EXAMPLE 1

Boron ions were implanted into silicon through a layer of thermally grown oxide having a thickness of 250 angstroms. The dosage was $3 \times 10^{14}$ ions/cm$^2$ and the power level for the implant was 20 KeV. The material was then annealed at 900° C. for 30 minutes in nitrogen.

Figure 2A:
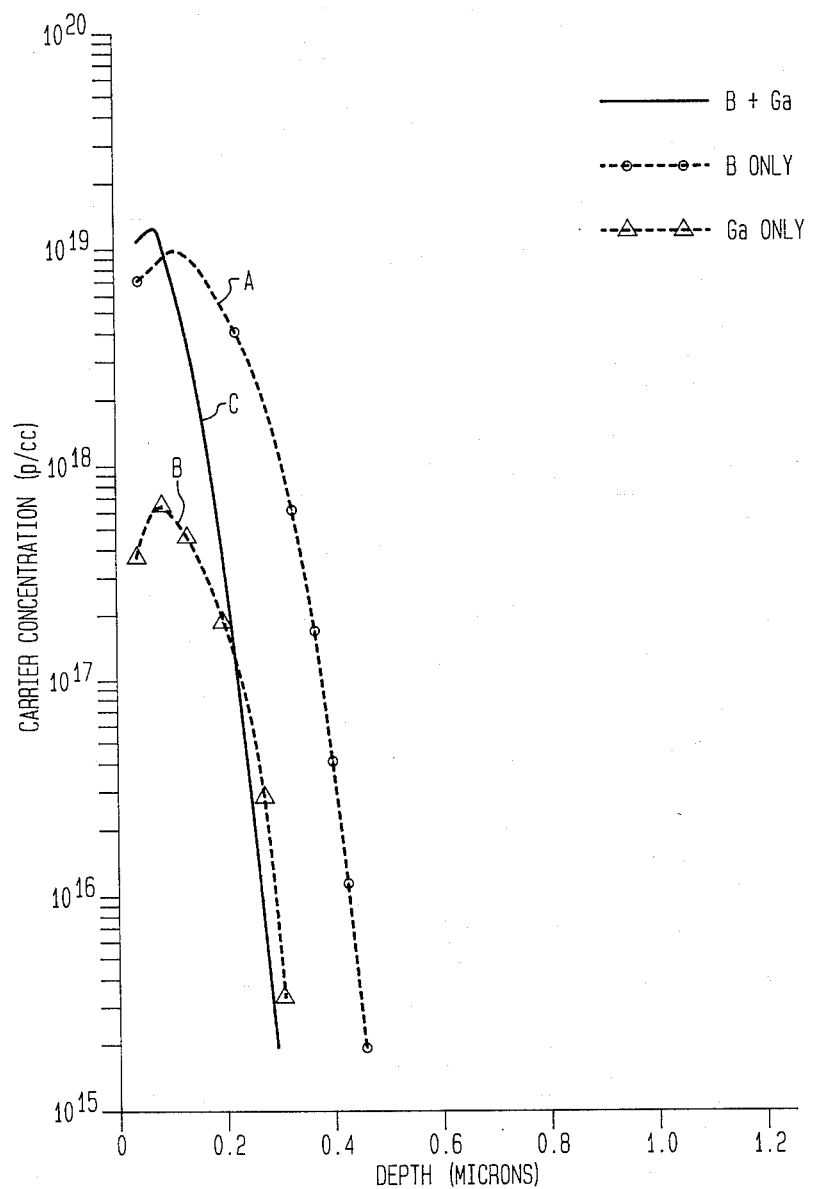
FIG. 2A is a graph illustrating the relative carrier concentration for each of boron, gallium and a combination of boron and gallium in an example of the invention.

The resulting concentration of p-type carriers had a distribution as shown by curve A in FIG. 2A. The concentration of boron (atoms/cc) had a distribution as shown by the dashed line curve labelled "B" in FIG. 2B.

EXAMPLE 2

Gallium ions were implanted into silicon through a layer of thermally grown oxide having a thickness of 250 angstroms. The dosage was $1 \times 10^{14}$ ions/cm$^2$ and the power level for the implant was 110 KeV. The material was then annealed at 900° C. for 30 minutes in nitrogen.

Figure 2B:
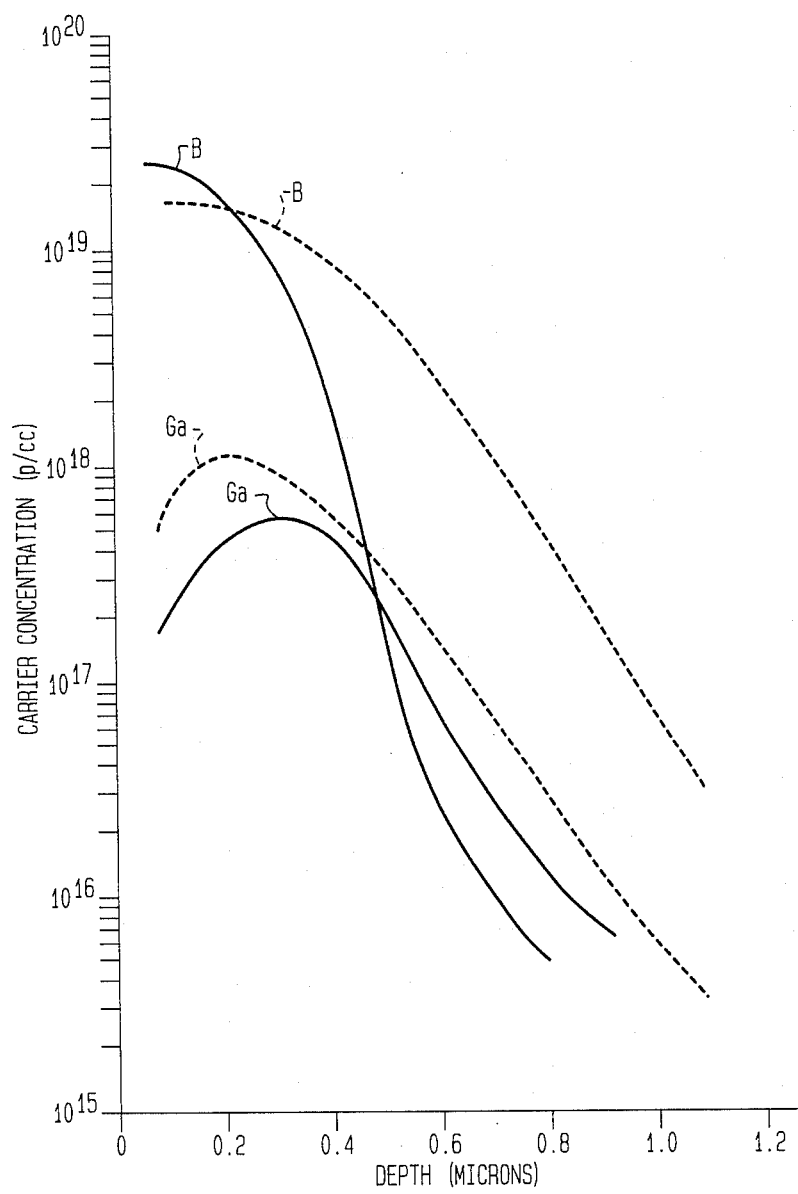
FIG. 2B is a graph illustrating the relative ion concentrations of boron and gallium when implanted individually and when they are paired in accordance with the present invention.

The resulting concentration of p-type carriers had a distribution as shown by curve B in FIG. 2A, and the gallium atoms were distributed as shown by the dashed line labelled "Ga" in FIG. 2B.

EXAMPLE 3

The same area of silicon substrate was implanted with boron ions as described in Example 1 and gallium ions were implanted as described in Example 2. The combined implants were then annealed at 900° C. for 30 minutes in nitrogen.

The resulting concentration of p-type carriers had a distribution as shown by curve C in FIG. 2A. The boron and gallium atoms had a distribution as represented by the two respective solid line curves in FIG. 2B. From these curves it can be seen that the two p-type dopants attract one another when they are paired and anneal together. This relative attraction results in the peak concentration of carriers being significantly closer to the surface of the substrate than with either impurity used alone. Accordingly, shallower p-type regions can be formed without increasing inherent resistance.

In the foregoing example the power levels of the implants are such that the projected range, $R_p$, of penetration of the ions are approximately the same for both boron and gallium. This is done to constrain the depth of boron during annealing. The mutual attraction of the two dopants can be used to impart other characteristics to the device, as shown in the following examples.

EXAMPLE 4

Figure 3:
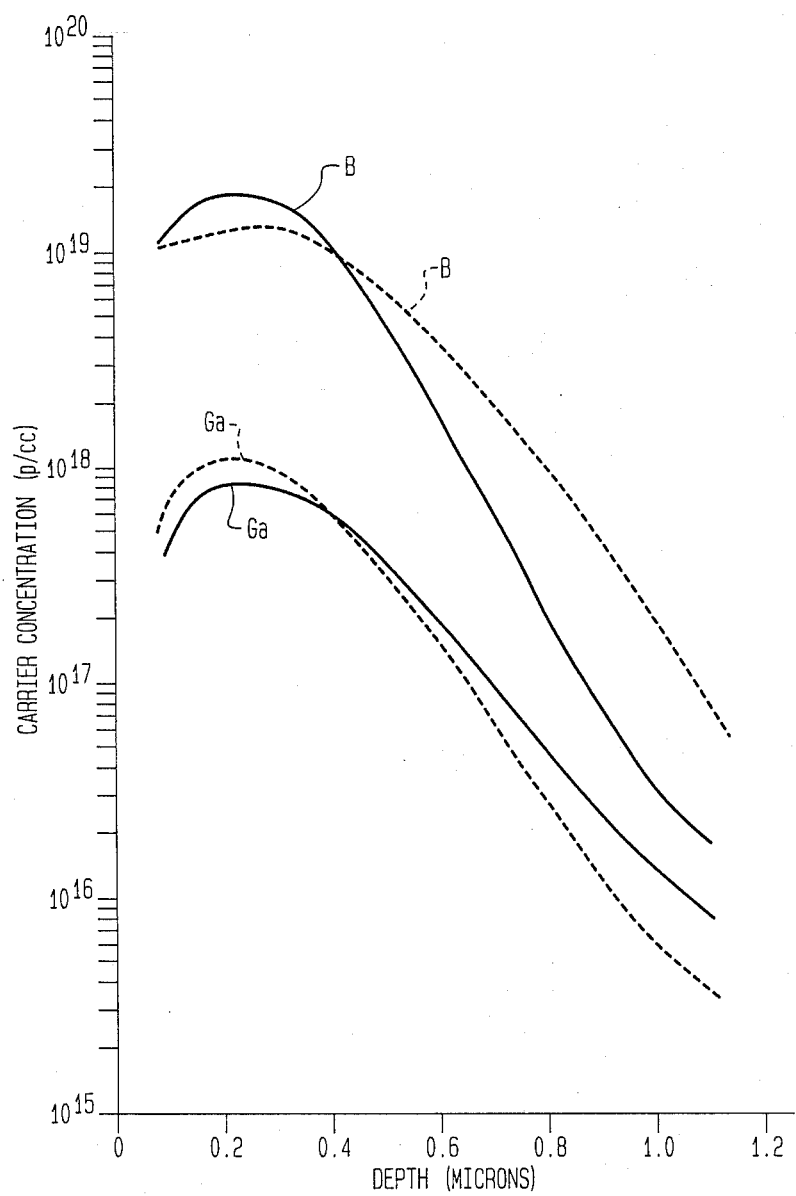
FIG. 3 is a graph similar to FIG. 2B illustrating the relative ion concentrations of boron and gallium under different implant conditions.

Boron ions were implanted into a silicon substrate at a dosage of $3 \times 10^{14}$ ions/cm$^2$ and a power level of 40 KeV. After annealing at 900° C. for 30 minutes, the boron atoms had a distribution as shown by the dashed line curve "B" of FIG. 3.

EXAMPLE 5

Gallium ions were implanted into a silicon substrate at a dosage of $1 \times 10^{14}$ ion/cm$^2$ and a power level of 60 KeV. After annealing, the distribution of gallium ions is shown by the dashed line curve "Ga" of FIG. 3.

EXAMPLE 6

Both boron and gallium ions were implanted into a substrate as described in Examples 4 and 5, respectively, and then annealed at 900° C. for 30 minutes. The ions of these two dopants had distributions as shown by the respective solid line curves of FIG. 3.

In the immediately preceding examples the projected range of the boron implant is much greater than that of the gallium implant (e.g., about 640Å deeper). As a result, the boron ions tend to "pull" the gallium ions deeper into the substrate during annealing. Such an ability to influence the diffusion of the gallium may be desirable in certain situations.

Although described with particular reference to the combination of boron and gallium, the concepts underlying the invention are not limited to these specific p-type dopants. For example, a combination of aluminum or indium with either boron or gallium also results in interactions which provide the same advantageous characteristics.

Figure 4:
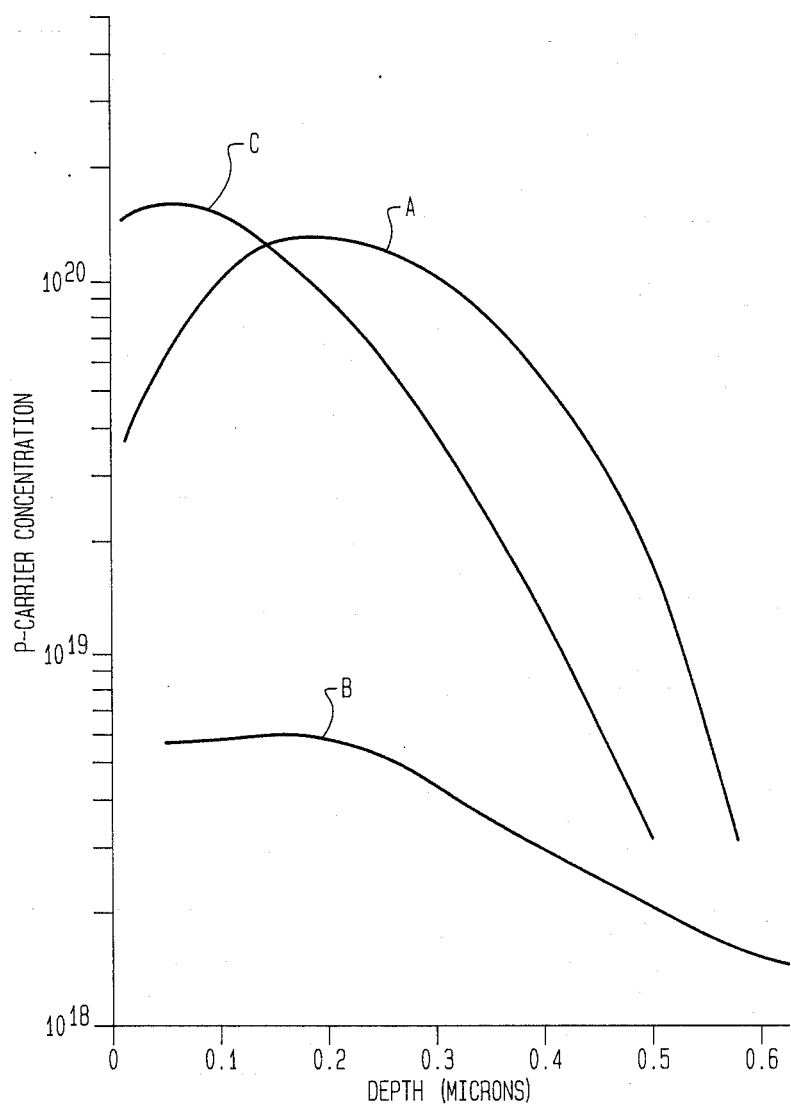
FIG. 4 is a graph similar to FIG. 2A illustrating the characteristics of a boron-aluminum combination.

FIG. 4 illustrates the particular results that are achieved when aluminum and boron are paired to form the p-type impurity. Curve A in FIG. 4 depicts the carrier concentration when boron alone is implanted with a dose of $6 \times 10^{15}$ at 50 KeV and annealed at 950° C. under neutral ambient conditions for 60 minutes. Curve B shows the carrier concentration when aluminum alone is implanted with a dose of $4 \times 10^{15}$ at 100 KeV and annealed at 950° C. under neutral ambient conditions for 60 minutes. When both boron and aluminum are implanted with these same dosages and annealed together under the same conditions, the resulting carrier concentration is as shown by Curve C. As can be seen, the combined impurities have an active carrier concentration profile that is substantially closer to the surface of the silicon than boron alone.

It will be appreciated by those of ordinary skill in the art that the present invention can be embodied in other specific forms without departing from the spirit or essential characteristics thereof. In particular, although specifically disclosed with respect to the formation of p-type source and drain regions in the fabrication of PMOS field-effect transistors, the invention is not limited thereto. Rather, it has applicability to almost any type of monolithic integrated circuit device in which it is desirable to control one or more of the properties of a p-type region.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A monolithic integrated circuit device having a p-type region adjacent a p-n junction which provides desired electrical characteristics, said p-type region being the product resulting from the process of simultaneously diffusing two different p-type impurities into said region such that interstitial ions of both said impurities attract one another in said region.

2. The monolithic integrated circuit of claim 1 wherein said p-type region is the product of a diffusion step which comprises the steps of implanting ions of each of said impurities and simultaneously annealing the implants.

3. A monolithic integrated circuit device having a p-n junction formed between an n-type region that is doped with at least one donor impurity and p-type region that is doped with two different acceptor impurities each of which are distributed throughout said p-type region.

4. The device of claim 3 wherein each of said acceptor impurities is selected from the group of boron, aluminum, gallium and indium.

5. An MOS field effect transistor, comprising:
   an n-type semiconductor substrate; and
   p-type source and drain regions formed in said substrate, each of said source and drain regions comprising a semiconductor that is doped with atoms of two different acceptor impurities.

6. The transistor of claim 5 wherein each of said acceptor impurities is selected from the group consisting of boron, aluminum, gallium and indium.

* * * * *